US012813183B2

(12) United States Patent
Jayanti et al.

(10) Patent No.: US 12,813,183 B2
(45) Date of Patent: Nov. 24, 2026

(54) SIMULTANEOUS DIELECTRIC ETCH WITH METAL PASSIVATION

(71) Applicant: Lam Research Corporation, Fremont, CA (US)

(72) Inventors: Sriharsha Jayanti, Fremont, CA (US); Gerardo Delgadino, Milpitas, CA (US); Merrett Wong, Palo Alto, CA (US); Taner Ozel, Fremont, CA (US); Aniruddha Joi, Milpitas, CA (US); Young Doo Jeong, Campbell, CA (US)

(73) Assignee: Lam Research Corporation, Fremont, CA (US)

( * ) Notice: Subject to any disclaimer, the term of this patent is extended or adjusted under 35 U.S.C. 154(b) by 142 days.

(21) Appl. No.: 18/864,437

(22) PCT Filed: May 9, 2023

(86) PCT No.: PCT/US2023/021530
§ 371 (c)(1),
(2) Date: Nov. 8, 2024

(87) PCT Pub. No.: WO2023/220054
PCT Pub. Date: Nov. 16, 2023

(65) Prior Publication Data

US 2025/0308919 A1 Oct. 2, 2025

Related U.S. Application Data

(60) Provisional application No. 63/341,568, filed on May 13, 2022.

(51) Int. Cl.
*H01L 21/311* (2006.01)
*H01J 37/32* (2006.01)
(Continued)

(52) U.S. Cl.
CPC ...... *H10P 50/283* (2026.01); *H01J 37/32137* (2013.01); *H10P 50/71* (2026.01);
(Continued)

(58) Field of Classification Search
CPC ........ H10P 50/283; H10P 50/71; H10P 50/73; H10P 50/268; H10P 50/285; H01J 37/32137; H10W 20/033; H10W 20/081
See application file for complete search history.

(56) References Cited

U.S. PATENT DOCUMENTS 5,217,570 A * 6/1993 Kadomura ............ H10P 50/267
257/E21.314
5,378,312 A * 1/1995 Gifford ................. B08B 7/0092
257/E21.252
(Continued)

FOREIGN PATENT DOCUMENTS

WO 2020/041213 2/2020
WO WO-2020041213 A1 * 2/2020 ........... H10P 2/7624

OTHER PUBLICATIONS

International Search Report and Written Opinion from International Application No. PCT/US2023/021530 dated Aug. 30, 2023.

*Primary Examiner* — Alexander Markoff
(74) *Attorney, Agent, or Firm* — Beyer Law Group LLP

(57) ABSTRACT

A method for selectively etching at least one feature in a nitrogen or carbon containing dielectric etch layer or a polysilicon etch layer under a mask in a stack, while providing profile control and CD control, is provided. An etch gas is flowed comprising an etchant and a metal containing passivant. The etch gas is formed into a plasma. The dielectric etch layer or polysilicon etch layer is exposed to the plasma to simultaneously etch features into the dielectric etch layer and deposit metal containing passivation on sidewalls of the features.

15 Claims, 5 Drawing Sheets

(51) Int. Cl.
*H01L 21/68* (2006.01)
*H10P 50/00* (2026.01)
*H10P 50/28* (2026.01)
*H10W 20/00* (2026.01)

(52) U.S. Cl.
CPC ........... *H10P 50/73* (2026.01); *H10W 20/033* (2026.01); *H10W 20/081* (2026.01)

(56) References Cited

U.S. PATENT DOCUMENTS

| | | | | |
|---|---|---|---|---|
| 5,858,879 | A * | 1/1999 | Chao | H10P 50/267 257/E21.314 |
| 6,589,879 | B2 | 7/2003 | Williams et al. | |
| 6,838,012 | B2 | 1/2005 | Lenz | |
| 6,921,725 | B2 | 7/2005 | Donohoe | |
| 9,378,971 | B1 * | 6/2016 | Briggs | H01J 37/32009 |
| 9,384,998 | B2 * | 7/2016 | Hudson | C23C 16/00 |
| 9,543,148 | B1 * | 1/2017 | Hudson | H01J 37/32091 |
| 9,620,377 | B2 | 4/2017 | Hudson et al. | |
| 9,887,097 | B2 | 2/2018 | Hudson | |
| 10,381,236 | B2 | 8/2019 | Kihara et al. | |
| 10,566,187 | B2 | 2/2020 | Qian et al. | |
| 2005/0181604 | A1 * | 8/2005 | Sperlich | H10P 50/71 257/E21.27 |
| 2006/0141647 | A1 * | 6/2006 | Kim | H10F 39/024 438/723 |
| 2008/0286978 | A1 | 11/2008 | Chen et al. | |
| 2010/0178761 | A1 * | 7/2010 | Chen | H10W 20/023 257/E21.585 |
| 2010/0327413 | A1 | 12/2010 | Lee et al. | |
| 2012/0164827 | A1 * | 6/2012 | Rajagopalan | H10P 14/6336 438/667 |
| 2012/0270395 | A1 | 10/2012 | Ku | |
| 2014/0213060 | A1 * | 7/2014 | Kao | H10P 50/267 438/703 |
| 2016/0163558 | A1 * | 6/2016 | Hudson | C23C 16/0209 156/345.24 |
| 2016/0293444 | A1 | 10/2016 | Park et al. | |
| 2019/0043723 | A1 * | 2/2019 | Zhou | H10P 50/267 |
| 2021/0184018 | A1 * | 6/2021 | Khaderbad | H10D 30/024 |
| 2021/0335624 | A1 | 10/2021 | Dole et al. | |
| 2022/0059347 | A1 * | 2/2022 | Joshi | H10P 14/2904 |
| 2022/0068661 | A1 | 3/2022 | Shaw et al. | |
| 2023/0298896 | A1 | 9/2023 | Veber et al. | |

* cited by examiner

SIMULTANEOUS DIELECTRIC ETCH WITH METAL PASSIVATION

CROSS-REFERENCE TO RELATED APPLICATION

This application claims the benefit of priority of U.S. Application No. 63/341,568, filed May 13, 2022, which is incorporated herein by reference for all purposes.

BACKGROUND

The background description provided here is for the purpose of generally presenting the context of the disclosure. Information described in this background section, as well as aspects of the description that may not otherwise qualify as prior art at the time of filing, are neither expressly nor impliedly admitted as prior art against the present disclosure.

The disclosure relates to methods of forming semiconductor devices on a semiconductor wafer. More specifically, the disclosure relates to the selective etching of an etch layer with respect to a mask, such as a hardmask.

The smallest feature dimensions of semiconductor devices are constantly shrinking to follow Moore's law. In the formation of features with small widths and high aspect ratios are etched into nitrogen or carbon containing layers or polysilicon layers. Silicon oxide (SiO) or photoresist may be used as a mask. Improved etch selectivity allows for a thinner mask, resulting in improved resolution.

One process frequently employed during the fabrication of semiconductor devices is the formation of an etched feature. Example contexts where such a process may occur include, but are not limited to, memory applications. As the semiconductor industry advances and device dimensions become smaller, such features become increasingly harder to etch in a uniform manner, especially for high aspect ratio features having narrow widths and/or deep depths.

Conventional processes for etching features in dielectric layers use hydrocarbons, fluorocarbons, or hydrofluorocarbons to passivate feature sidewalls and control CDs. As the feature CDs shrink, conventional processes suffer from multiple issues, including the limited capability to control CDs, mask profile, and mask morphology. Depending on the application, such issues can sometimes be mitigated with advanced RF pulsing capabilities. However, this usually leads to tradeoffs or compromises in the etch profiles.

SUMMARY

To achieve the foregoing and in accordance with the purpose of the present disclosure, a method for selectively etching at least one feature in a nitrogen or carbon containing dielectric etch layer or a polysilicon etch layer under a mask in a stack, while providing profile control and CD control, is provided. An etch gas is flowed comprising an etchant and a metal containing passivant. The etch gas is formed into a plasma. The dielectric etch layer or polysilicon etch layer is exposed to the plasma to simultaneously etch features into the dielectric etch layer and deposit metal containing passivation on sidewalls of the features.

These and other features of the present disclosure will be described in more detail below in the detailed description and in conjunction with the following figures.

BRIEF DESCRIPTION OF THE DRAWINGS

The present disclosure is illustrated by way of example, and not by way of limitation, in the figures of the accompanying drawings and in which like reference numerals refer to similar elements and in which.

DETAILED DESCRIPTION OF THE EXEMPLARY EMBODIMENTS

The present disclosure will now be described in detail with reference to a few exemplary embodiments thereof as illustrated in the accompanying drawings. In the following description, numerous specific details are set forth in order to provide a thorough understanding of the present disclosure. It will be apparent, however, to one skilled in the art, that the present disclosure may be practiced without some or all of these specific details. In other instances, well-known process steps and/or structures have not been described in detail in order to not unnecessarily obscure the present disclosure.

In the formation of semiconductor devices, a stack with one or more dielectric layers may be etched. In some embodiments, the stack comprises one or more carbon or nitrogen containing layers, such as one or more layers of silicon carbide (SiC), silicon nitride (SiN), silicon oxynitride (SiON), amorphous carbon, and photoresist. In some embodiments, a polysilicon layer in a stack is etched. Conventional processes for etching features in dielectric layers use hydrocarbons, fluorocarbons, or hydrofluorocarbons to passivate feature sidewalls and control CDs. As the feature CDs shrink, conventional processes suffer from multiple issues, including the limited capability to control CDs, mask profile, and mask morphology. Depending on the application, such issues can sometimes be mitigated with advanced RF pulsing capabilities. However, this usually leads to tradeoffs or compromises in the etch profiles. For etching a silicon nitride layer or silicon carbide layer under a silicon mask or carbon containing mask, when hydrocarbons, fluorocarbons, or hydrofluorocarbons are used for passivation, passivation deposits near an opening of the polysilicon mask, causing necking. When too much passivation builds up near the opening of the polysilicon mask, the etch features may become tapered or the buildup may cause etch stop. The necking causes a change of etch rate and CD, making etch rate control and CD control more difficult. Various parameters, such as power, pressure, bias, gas flow, and gas ratios may be used to reduce taper and etch stop and control aspect ratio. However, the adjustment of such parameters can affect bowing, etch selectivity, CD, and other characteristics of the etch features.

Some embodiments provide an etch of a stack comprising one or more carbon or nitrogen containing dielectric etch layers or polysilicon etch layers by simultaneously etching the stack and providing a metal containing sidewall passivation. In some embodiments, the stack may comprise one or more of silicon nitride, Silicon carbide, silicon carbon nitride (SiCN), silicon oxynitride, amorphous carbon, polysilicon, and photoresist.

Figure 1:
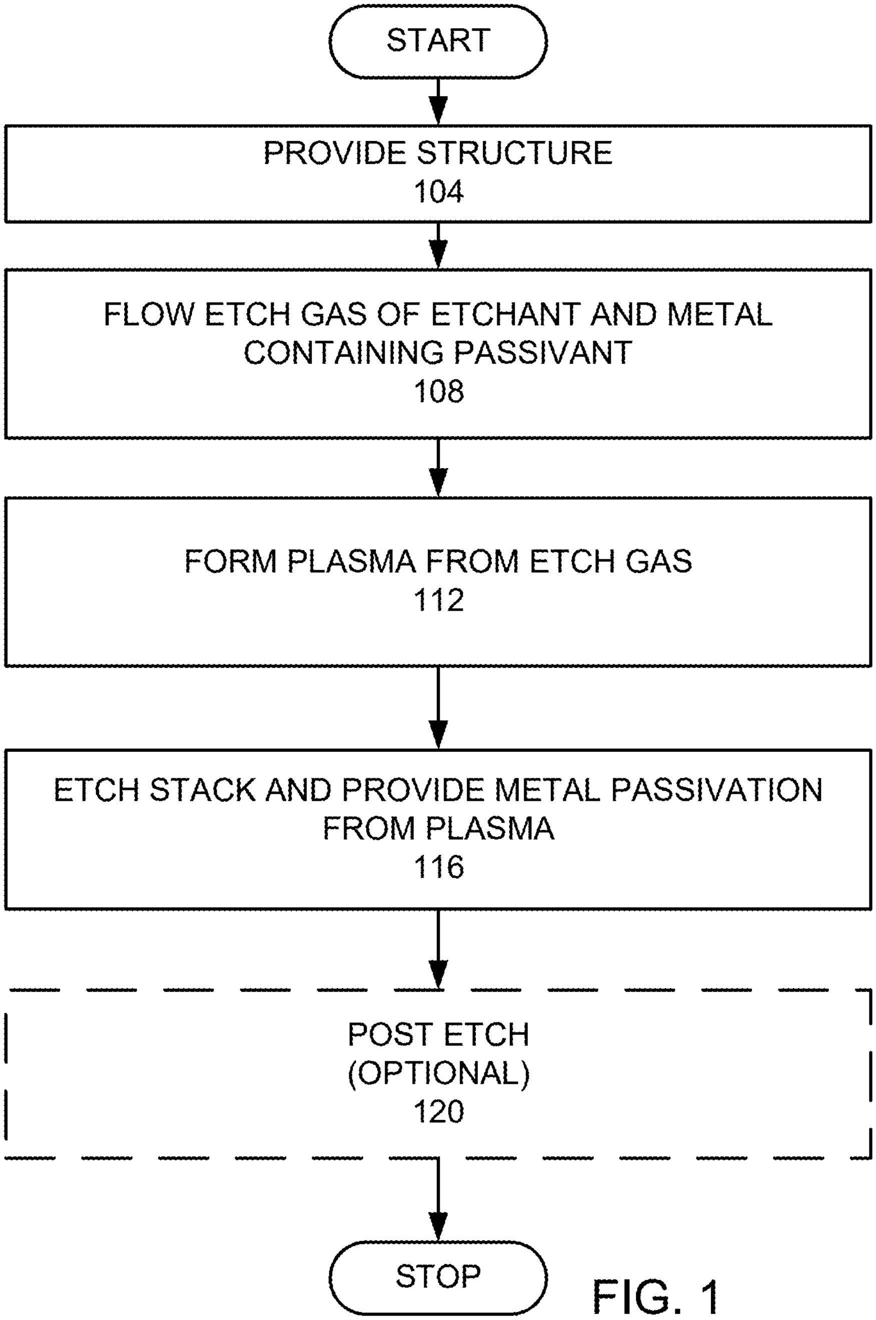
FIG. 1 is a high level flow chart of an embodiment.

In order to facilitate understanding, FIG. 1 is a high level flow chart of a process used in some embodiments. A structure is provided (step 104) into an etch chamber. In some embodiments, the structure comprises a stack of one or more nitrogen or carbon containing dielectric layers. In some embodiments, the nitrogen or carbon containing dielectric layers may be one or more of silicon carbide, silicon nitride, silicon oxynitride, amorphous carbon, and photoresist. In some embodiments, the structure comprises a polysilicon layer.

The stack is etched in the etch chamber. In order to etch the stack, an etch gas comprising an etchant and metal containing passivant is provided (step 108). In some embodiments, the etchant is an oxygen containing component or a halogen containing component. In some embodiments, the oxygen containing component comprises at least one of oxygen ($O_2$), ozone ($O_3$), carbon dioxide ($CO_2$), carbon monoxide (CO), carbonyl sulfide (COS), nitrogen dioxide ($NO_2$), nitrate ($NO_3$), and sulfur dioxide ($SO_2$). In some embodiments, the halogen containing component comprises at least one of a hydrofluorocarbon ($C_xH_yF_z$), such as fluoromethane ($CH_3F$), difluoromethane ($CH_2F_2$), and fluoroform ($CHF_3$), a fluorocarbon ($C_xF_y$), such as carbon tetrafluoride ($CF_4$), octafluorocyclobutane ($C_4F_8$), and hexafluorobutadiene ($C_4F_6$), hydrogen bromide (HBr), hydrogen fluoride (HF), hydrogen chloride (HCl), hydrogen iodide (HI), boron trichloride ($BCl_3$), and chlorine ($Cl_2$). Generally, the etch gas has a lean chemistry to minimize the deposition of polymer in order to prevent necking. In various embodiments, the halogen containing component comprises at least one of fluorocarbon, such as carbon tetrafluoride, hexafluorobutadiene, octafluorocyclobutane, and fluorohydrocarbon.

In some embodiments, the metal containing passivant contains a component containing at least one of molybdenum (Mo), rhenium (Re), tantalum (Ta), tungsten (W), or vanadium (V). For example, the metal containing passivant comprises at least one of rhenium hexafluoride ($ReF_6$), molybdenum hexafluoride ($MoF_6$), tantalum pentafluoride ($TaF_5$), tungsten hexafluoride ($WF_6$), and vanadium fluoride ($VF_5$). In some embodiments, the etch gas further comprises an inert diluent. In some embodiments, the inert diluent is one or more noble gases, such as helium (He), Neon (Ne), argon (Ar), Krypton (Kr), and Xenon (Xe).

The etch gas is formed into a plasma (step 112). In some embodiments, RF excitation power is provided to transform the etch gas into a plasma. The RF power may be provided at various frequencies. In various embodiments, the RF power is provided at frequencies of at least one of 13.56 megahertz (MHz), 60 MHz, 27 MHz, 2 MHz, 1 MHz, and 400 kilohertz (kHz).

The plasma is used to etch the stack to form etch features and provide metal containing passivation of the sidewalls of the etch features (step 116). The etchant in the plasma etches the etch layer to etch the etch features into the etch layer. The metal containing passivant forms a metal containing passivation layer on the sidewalls of the etch features. In some embodiments, a bias is provided to provide a more directional etch.

In some embodiments, an optional post etch process is provided (120). In some embodiments, the post etch is a chemical etch used to remove the metal containing passivation layer. In some embodiments, the post etch process etches a layer under the etch layer and then the etch layer is removed along with the metal containing passivation layer.

It has been found that the metal containing passivation layer is more etch resistant than polymer passivation. Therefore, some embodiments provide more etch resistant passivation than processes that use a polymer passivation. In addition, it has been found that the metal containing passivation layer is more resistant to ion bombardment than polymer passivation. Therefore, etch features with metal containing passivation layers are less subject to bowing. Therefore, tuning may be optimized for etch selectivity and CD, without an optimization for a reduction in bowing. In addition, it has been found that providing both the etchant and the metal containing passivant in the etch gas provides a more robust process that allows for an optimization that helps eliminate etch stop. In some embodiments, some of the metal containing passivation layer may be deposited on the etch front. To prevent etch stop, sufficient bias power is provided to remove any metal containing passivation layer on the etch front. It has been found that providing an etch gas without a metal containing passivant and having a separate metal containing passivation step with a metal containing passivant causes a less robust method increasing the likelihood of causing an etch stop.

Example 1

Figure 2A:
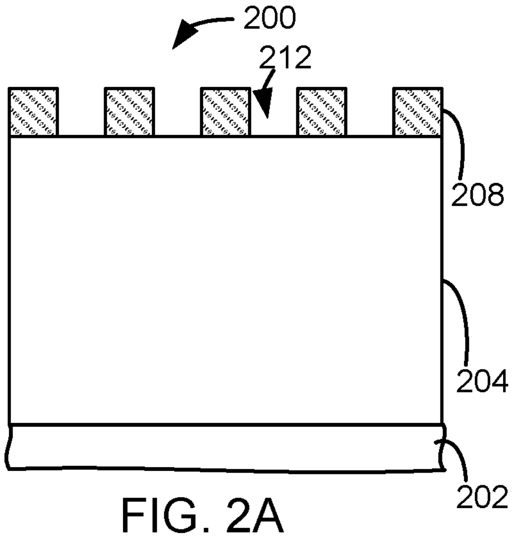
FIGS. 2A-C are schematic cross-sectional views of structures processed according to some embodiments.

In some embodiments, the providing the structure with a dielectric etch layer under a mask (step 104) provides a silicon nitride or silicon carbide etch layer under a polysilicon mask. In this example, the structure may be used for a capacitor etch. FIG. 2A is a schematic cross-sectional view of part of a structure 200 with a stack of a single etch layer 204 of silicon nitride over a substrate 202, such as a wafer, and under a mask 208 of polysilicon. The mask 208 is patterned forming mask features 212. One or more layers may be between the substrate 202 and the single etch layer 204. The structure 200 is placed in an etch chamber (step 104).

An etch gas comprising an etchant and a metal containing passivant is flowed into the etch chamber (step 108). In this example, the etchant comprises a hydrofluorocarbon, such as trifluoromethane, and the metal containing passivant comprises tungsten hexafluoride. In some embodiments, the etch gas further comprises an inert diluent. In some embodiments, the inert diluent is one or more noble gases. The etchant gas provides a pressure in a range of 5 mTorr to 400 mTorr.

The etch gas is transformed into a plasma (step 112). In this example, RF power is provided at one or more frequencies of 400 kHz, 2 MHz, 27 MHz, and 60 MHz. The RF power may be used to provide bias in addition to plasma excitation. The amount of bias is dependent on the application. For higher aspect ratio features a higher bias is used. Since, this application has higher aspect ratio features, a higher bias is provided. In addition, in applications where there is more likely to be etch stop, a higher bias is used to prevent etch stop.

Figure 2B:
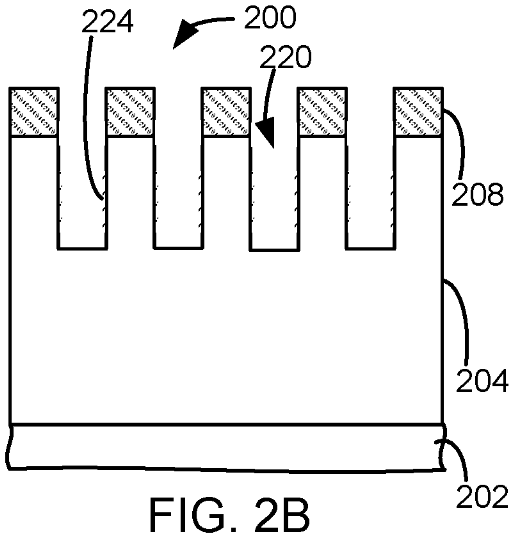

The stack is exposed to the plasma. The plasma selectively etches etch features in the etch layer 204 and deposits a metal containing passivation on the sidewalls of the etch features (step 116). FIG. 2B is a schematic cross-sectional view of part of the structure 200 after etch features 220 have been partially etched. A metal containing passivation layer 224 has been deposited on the sidewalls of the etch features 220. The metal containing passivation layer 224 is not drawn to scale in order to more clearly show the metal containing passivation layer 224. In this example, the metal containing passivation layer comprises tungsten nitride where the tungsten is provided by tungsten hexafluoride and nitrogen is provided by the silicon nitride etch layer 204. By providing the etchant and the metal containing passivant at the same time, instead of providing metal containing passivant without an etchant at some time, the metal containing passivation layer 224 is not formed at the etch front, so that etch stop is avoided. In some embodiments, some of the metal containing passivation layer may be deposited on the etch front. To prevent etch stop, sufficient bias power is provided to remove any metal containing passivation layer on the etch front. In addition, the simultaneous etching and deposition of a metal containing passivation layer provides a faster etching process and faster throughput. In addition, various etch parameters, such as pressure, RF power, bias power, and gas flow rates may be adjusted to cause the metal containing passivation layer 224 to be deposited on locations of the sidewalls of the etch features 220 that would be most subject to bowing, while removing or preventing metal containing passivation at other locations in the etch features. Some embodiments provide a simultaneous etch and formation of a metal containing passivation layer while preventing etch stop and controlling CD.

Figure 2C:
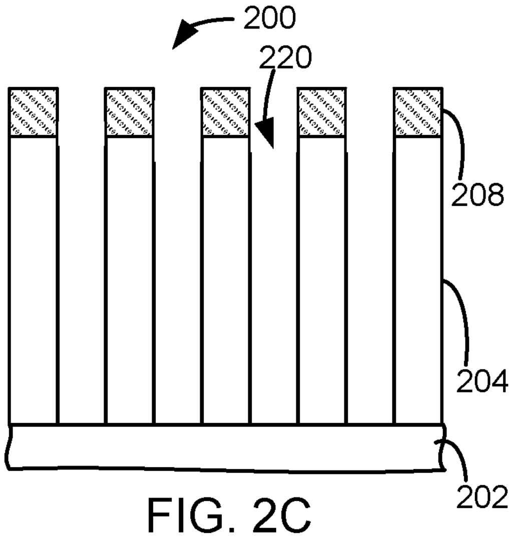

FIG. 2C is a schematic cross-sectional view of the structure 200 after the etching of the etch features 220 is completed. In this example, the metal containing passivation layer is removed during the etch process. In other embodiments, a subsequent process may be used to remove the metal containing passivation layer. In some embodiments, near the end of the etch process, the flow rate of the metal containing passivant is ramped down, so that there is no or little remaining metal containing passivation layer at the end of the etch process.

In some embodiments, an optional post etch process is provided (step 120) to remove all remaining metal containing passivation layer. An example post etch process for removing the remaining metal containing passivation layer would use a post etch process gas containing fluorocarbons and oxygen. In some embodiments, an optional post etch process further etches or shapes the etch features. An example process for further etching and/or shaping the features would use a post etch process gas containing fluorocarbons and oxygen for etching a SiO2 underlayer. In some embodiments, the features would have a CD of no more than 40 nm and a height to width aspect ratio of at least 6:1.

Example 2

Figure 3A:
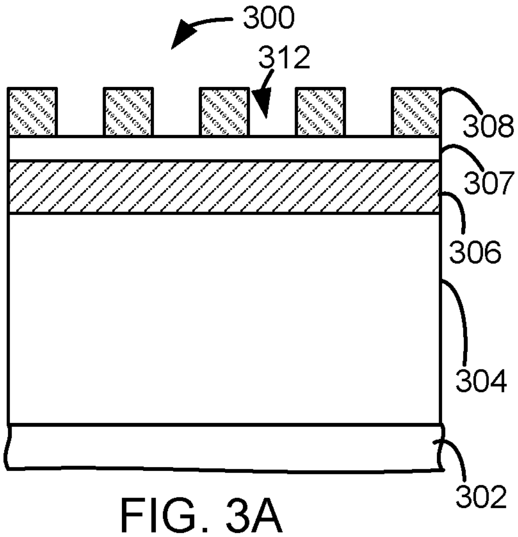
FIGS. 3A-D are schematic cross-sectional views of structures processed according to some embodiments.

In some embodiments, the providing the structure with a dielectric etch layer under a mask (step 104) provides a carbon containing, such as amorphous carbon, etch layer under a bottom antireflective coating (BARC), which in some embodiments is made of a material comprising silicon and either nitrogen or carbon, such as silicon nitride, silicon oxynitride, and silicon carbide, under a photoresist mask in an etch chamber. In some embodiments, the carbon containing layer is a carbon based layer, such as amorphous carbon. In the specification and claims, a carbon based material would be at least 50% carbon by weight. FIG. 3A is a schematic cross-sectional view of part of a structure 300 with a stack of a substrate 302 under an underlayer 304 under an amorphous carbon etch layer 306 under a BARC layer 307, under a photoresist mask 308. The mask 308 is patterned forming mask features 312. The structure 300 is provided into an etch chamber (step 104).

In order to open the BARC 307, an etch gas comprising an etchant and a metal containing passivant is flowed into the etch chamber (step 108). In this example, the etchant comprises halogen containing component, and the metal containing passivant comprises tungsten hexafluoride. In some embodiments, the etch gas further comprises an inert diluent. In some embodiments, the inert diluent is one or more noble gases. The etchant gas provides a pressure in a range of 5 mTorr to 500 mTorr.

The etch gas is transformed into a plasma (step 112). In this example, RF power is provided at one or more frequencies of 400 kHz, 2 MHz, 27 MHz, and 60 MHz. The RF power may be used to provide bias in addition to plasma excitation. The amount of bias is dependent on the application. For higher aspect ratio features a higher bias is used. In addition, in applications where there is more likely to be etch stop, a higher bias is used to prevent etch stop. Since this embodiment is for opening the BARC, the features are not high aspect ratio features.

The stack is exposed to the plasma. The plasma selectively etches etch features in the BARC 307 and deposits a metal containing passivation on the sidewalls of the etch features (step 116). A metal containing passivation layer is deposited on sidewalls of the etch features. In this example, the metal containing passivation layer comprises tungsten carbide and/or tungsten nitride, where the tungsten is provided by tungsten hexafluoride and the carbon or nitrogen is provided by the BARC 307. To prevent etch stop, sufficient bias power is provided to remove any metal containing passivation layer on the etch front. In addition, various etch parameters, such as pressure, RF power, bias power, and gas flow rates may be adjusted to cause the metal containing passivation layer to be deposited on locations of the sidewalls of the etch features that would be most subject to bowing, while removing or preventing metal containing passivation at other locations in the etch features.

In order to open the amorphous carbon etch layer 306, an etch gas comprising an etchant and a metal containing passivant is flowed into the etch chamber (step 108). In this example, the etchant comprises an oxygen containing component, and the metal containing passivant comprises tungsten hexafluoride. In some embodiments, the etch gas further comprises an inert diluent. In some embodiments, the inert diluent is one or more noble gases. In some embodiments, the oxygen containing component comprises at least one of oxygen, ozone, carbon dioxide, carbon monoxide, carbonyl sulfide, nitrogen dioxide, nitrate, and sulfur dioxide. The etchant gas provides a pressure in a range of 5 mTorr to 500 mTorr.

The etch gas is transformed into a plasma (step 112). In this example, RF power is provided at one or more frequencies of 400 kHz, 2 MHz, 27 MHz, and 60 MHz. The RF power may be used to provide bias in addition to plasma excitation. The amount of bias is dependent on the application. For higher aspect ratio features a higher bias is used. In addition, in applications where there is more likely to be etch stop, a higher bias is used to prevent etch stop. Since this embodiment is for opening a mask, the features are not high aspect ratio features.

The stack is exposed to the plasma. The plasma selectively etches etch features in the etch layer and deposits a metal containing passivation on the sidewalls of the etch features (step 116). A metal containing passivation layer is deposited on sidewalls of the etch features. In this example, the metal containing passivation layer comprises tungsten carbide, where the tungsten is provided by tungsten hexafluoride and carbon is provided by the amorphous carbon etch layer 306. By providing the etchant and the metal containing passivant at the same time, instead of providing a metal containing passivant without an etchant at some time, the metal containing passivation layer is not formed at the etch front, so that etch stop is avoided. In some embodiments, some of the metal passivation layer may be deposited on the etch front. To prevent etch stop, sufficient bias power is provided to remove any metal containing passivation layer on the etch front. In addition, various etch parameters, such as pressure, RF power, bias power, and gas flow rates may be adjusted to cause the metal containing passivation layer to be deposited on locations of the sidewalls of the etch features that would be most subject to bowing, while removing or preventing metal passivation at other locations in the etch features.

Figure 3B:
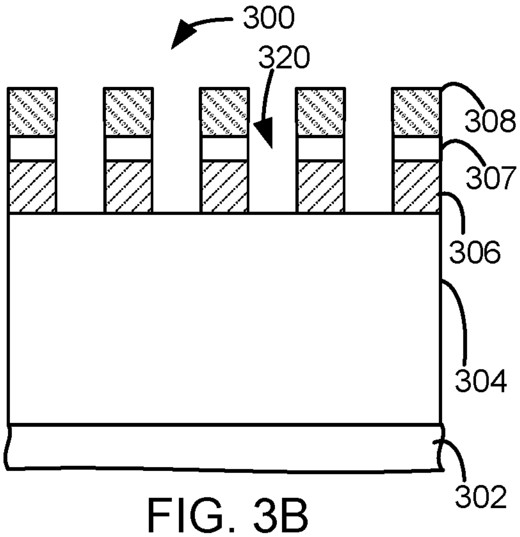

FIG. 3B is a schematic cross-sectional view of the structure 300 after etch features 320 have been etched into the BARC 307 and the amorphous carbon etch layer 306. In this example, the metal containing passivation layer is removed during the etch process. In other embodiments, a subsequent process may be used to remove the metal containing passivation layer.

In some embodiments, an optional post etch process is provided (step 120). In this example, the underlayer 304 is a silicon containing layer under the amorphous carbon etch layer 306. In this example, the amorphous carbon etch layer 306 is used as a mask for etching the silicon containing underlayer 304.

Figure 3C:
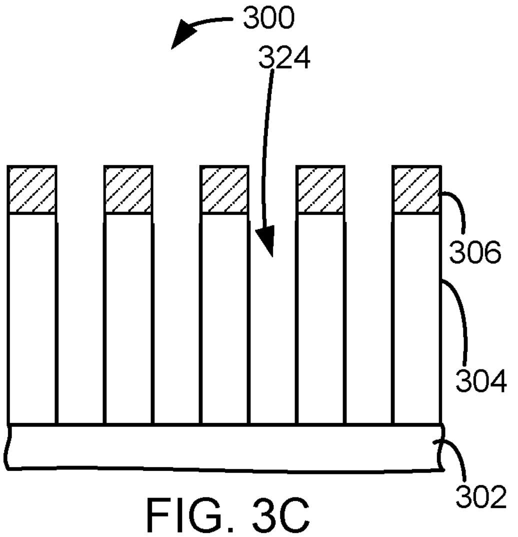

FIG. 3C is a schematic cross-sectional view of the structure 300 after etch features 324 have been etched into the underlayer 304. The pattern formed by the amorphous carbon layer 306 has been transferred into the underlayer 304. In this example, the etching of the silicon containing underlayer 304 etches away the mask and BARC.

Figure 3D:
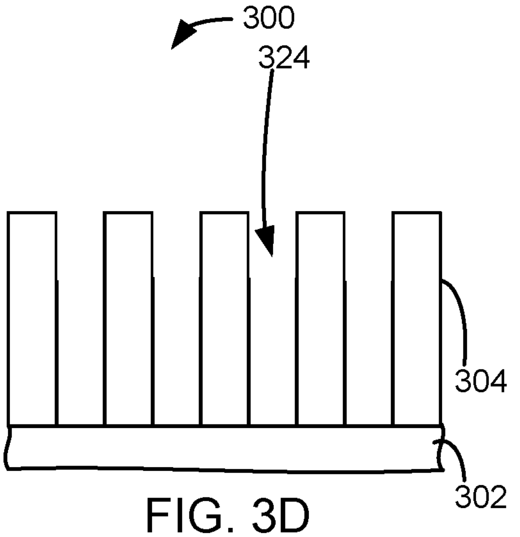

In some embodiments, the post etch process (step 120) may further comprise one or more processes that remove the amorphous carbon etch layer 306. Such processes may also remove any remaining metal containing passivation layer. FIG. 3D is a schematic cross-sectional view of the structure 300 after the amorphous carbon etch layer 306, shown in FIG. 3C, has been removed. In some embodiments, the metal containing passivation layer is removed with the removal of the amorphous carbon etch layer 306.

Various Embodiments

In some embodiments, the stack may be a single layer of a nitrogen containing or carbon containing layer, such as a single silicon nitride or amorphous carbon layer. In some embodiments, the stack may be a plurality of layers where at least one layer is a nitrogen containing layer or carbon containing layer. For example, the stack may be a stack of alternating layers of silicon nitride and silicon oxide (ONON). In some embodiments, the requirement that the etch layer contains nitrogen or carbon requires a sufficient amount of nitrogen or carbon to allow the metal containing passivant to form a metal nitride or metal carbide passivation layer on the sidewalls of the feature. Since the metal nitride or metal carbide passivation layer is more resistant to chemical etching and ion bombardment, the metal nitride or metal carbide passivation layer reduces bowing and CD enlargement caused by sidewall etching. As a result, in some embodiments, etch parameters such as pressure, RF power, RF bias, and temperature may be tuned to optimize other etch characteristics, such as selectivity, aspect ratio, dense versus isolation loading, profile control, CD control, and tapering. In some embodiments, the bias is adjusted in order to adjust the aspect ratio. In addition, in some embodiments, the etch parameters are more robust, allowing for a larger parameter window.

In some embodiments, the metal containing passivant comprises tungsten. In such embodiments, the metal containing passivation layer comprises tungsten carbide or tungsten nitride, where the carbon or nitrogen is provided by the nitrogen or carbon containing etch layer. In some embodiments, the nitrogen or carbon containing etch layer further comprises silicon. In some embodiments, the carbon containing etch layer is a carbon based etch layer, such as amorphous carbon and photoresist.

Instead of merely keeping CD from increasing, some embodiments are able to tune CD. By controlling the flow of the metal containing gas, the CD in the carbon or nitrogen containing layer may be tuned without compromising the mask shape.

In some embodiments, the etch process may be used to provide a capacitor etch. In some embodiments, the etch process may be used in forming dynamic random access memory. In some embodiments, if the etch layer is a polysilicon layer, if the metal containing passivant is tungsten hexafluoride, elemental tungsten is deposited on sidewalls of the polysilicon layer as a metal containing passivation layer instead of tungsten carbide or tungsten nitride, if nitrogen and carbon are not present during the etch process. In some embodiments, flow ratios of the different components of the etch gas may be varied during a process.

Apparatus

Figure 4:
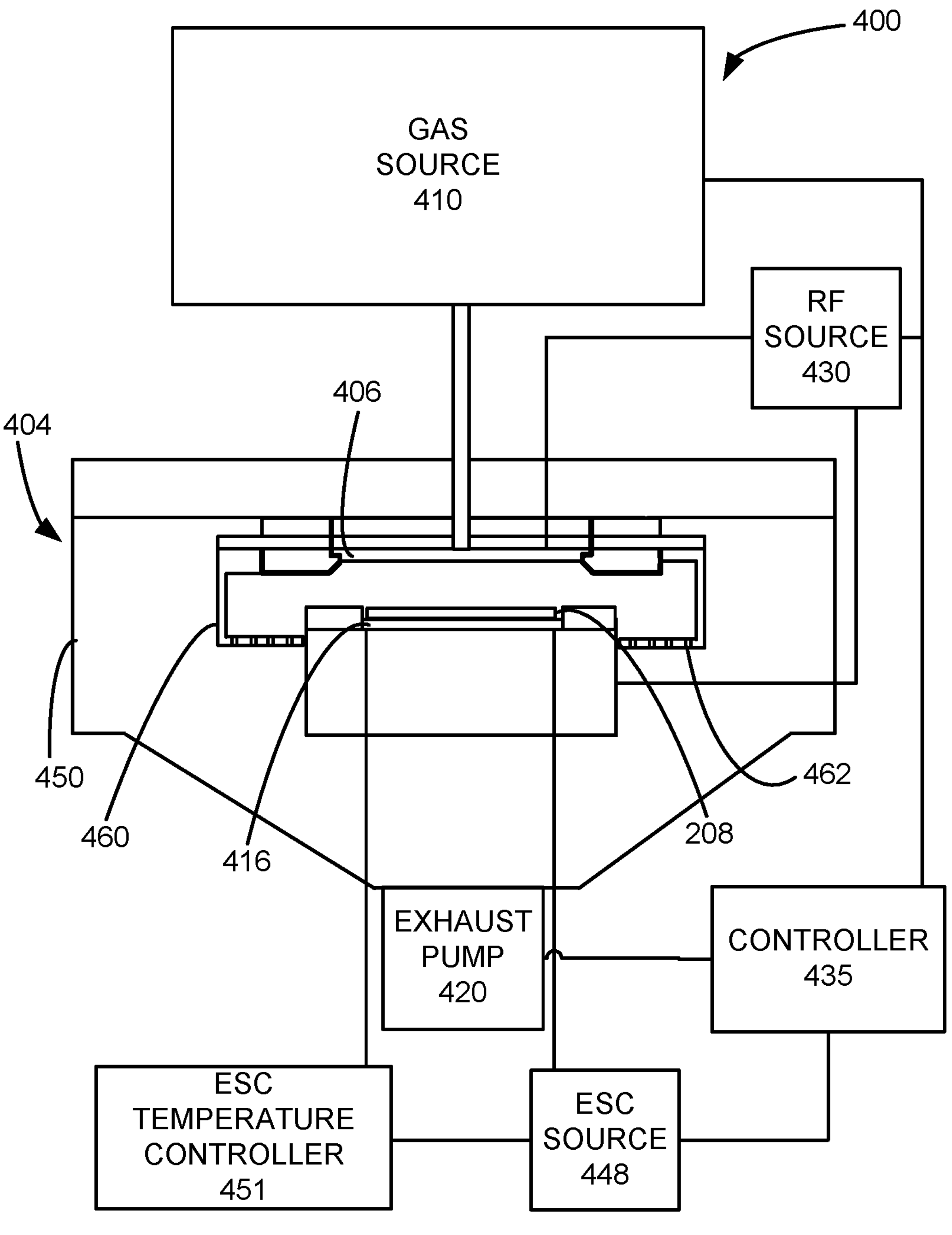
FIG. 4 is a schematic view of a etch chamber that may be used in an embodiment.

To facilitate understanding, FIG. 4 is a schematic view of a plasma processing chamber 400 for plasma processing substrates, in an embodiment. In one or more embodiments, the plasma processing chamber 400 comprises a gas distribution plate 406 providing a gas inlet and an electrostatic chuck (ESC) 416, within a plasma processing chamber 404, enclosed by a chamber wall 450. Within the plasma processing chamber 404, the substrate 202 is positioned on top of the ESC 416 that acts as a substrate support. The ESC 416 may provide a bias from an ESC power source 448. A gas source 410 is connected to the plasma processing chamber 404 through the gas distribution plate 406. An ESC temperature controller 451 is connected to the ESC 416 and provides temperature control of the ESC 416. A radio frequency (RF) power source 430 provides RF power to the ESC 416 and an upper electrode. In this embodiment, the upper electrode is the gas distribution plate 406. In a preferred embodiment, 400 kilohertz (kHz), 13.56 megahertz (MHz), 1 MHz, 2 MHz, 60 MHz, and/or optionally, 27 MHz power sources make up the RF power source 430 and the ESC power source 448. A controller 435 is controllably connected to the RF power source 430, the ESC power source 448, an exhaust pump 420, and the gas source 410. A high flow liner 460 is a liner within the plasma processing chamber 404, which confines gas from the gas source and has slots 462. The slots 462 maintain a controlled flow of gas to pass from the gas source 410 to the exhaust pump 420. An example of such a plasma processing chamber is the Flex® etch system manufactured by Lam Research Corporation of Fremont, CA. The process chamber can be a CCP (capacitively coupled plasma) reactor or an ICP (inductively coupled plasma) reactor.

Figure 5:
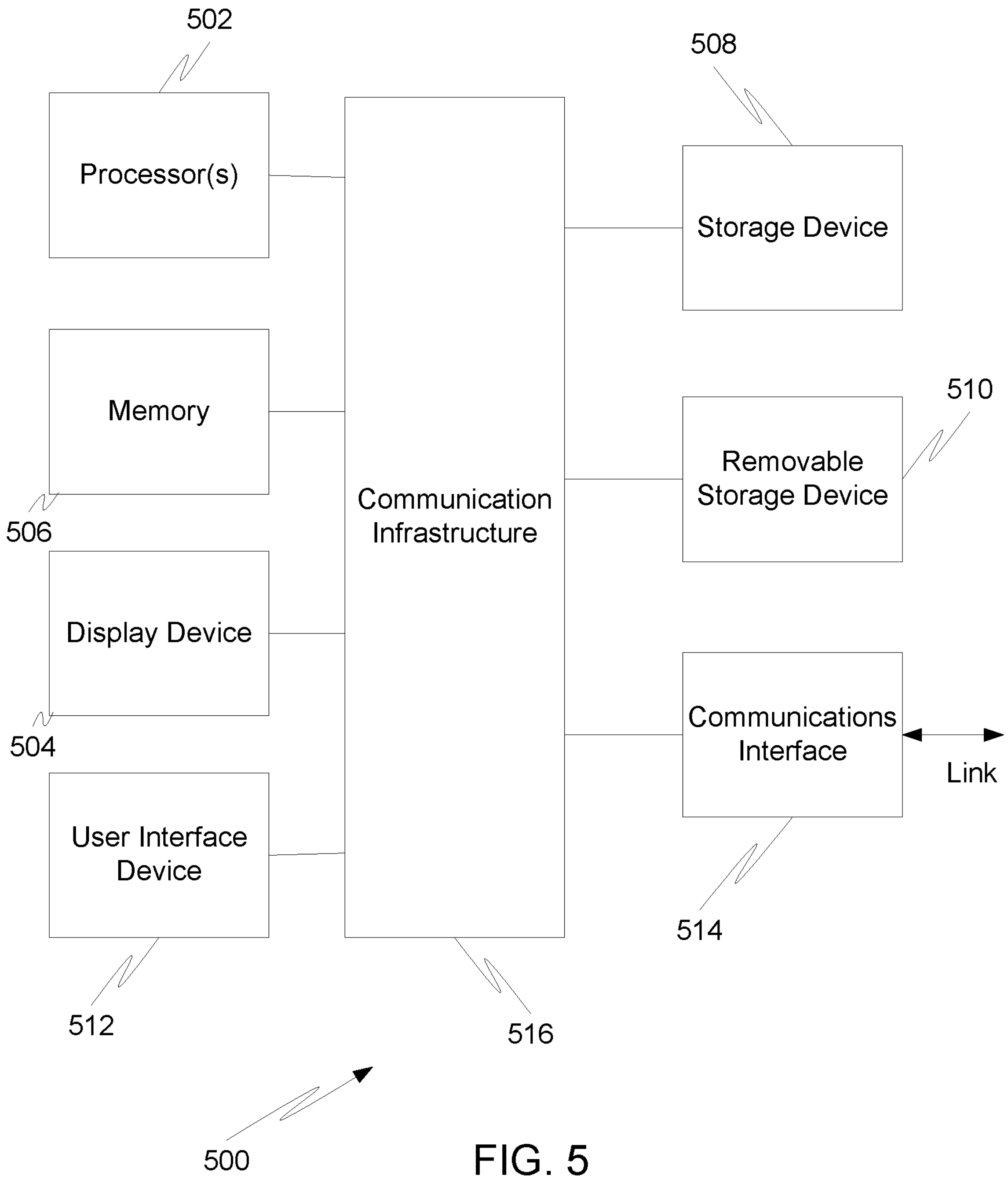
FIG. 5 is a schematic view of a computer system that may be used in practicing an embodiment.

FIG. 5 is a high level block diagram illustrating a computer system 500 for implementing the controller 435 used in embodiments of the present inventions. The computer system may have many physical forms ranging from an integrated circuit, a printed circuit board, and a small handheld device up to a huge supercomputer. The computer system 500 may include one or more processors 502, and further can include an electronic display device 504 (for displaying graphics, text, and other data), a main memory 506 (e.g., random access memory (RAM)), storage device 508 (e.g., hard disk drive), removable storage device 510 (e.g., optical disk drive), user interface devices 512 (e.g., keyboards, touch screens, keypads, mice or other pointing devices, etc.), and/or a communication interface 514 (e.g., wireless network interface). The communication interface 514 may allow software and/or data to be transferred between the computer system 500 and external devices via a link. The system may also include a communications infrastructure 516 (e.g., a communications bus, cross-over bar, or network) to which the aforementioned devices/modules may be connected.

Information transferred via communications interface 514 may be in the form of signals such as electronic, electromagnetic, optical, or other signals capable of being received by communications interface 514, via a communication link that carries signals and may be implemented using wire or cable, fiber optics, a phone line, a cellular phone link, a radio frequency link, and/or other communication channels. With such a communications interface, it is contemplated that the one or more processors 502 might receive information from a network or might output information to the network in the course of performing the above-described method steps. Furthermore, method embodiments may execute solely upon the processors or may execute over a network such as the Internet in conjunction with remote processors that shares a portion of the processing.

The term "non-transient computer readable medium" is used generally to refer to media such as main memory, secondary memory, removable storage, and storage devices, such as hard disks, flash memory, disk drive memory, CD-ROM, and other forms of persistent memory and shall not be construed to cover transitory subject matter, such as carrier waves or signals. Examples of computer code include machine code, such as produced by a compiler, and files containing higher level code that are executed by a computer using an interpreter. Computer readable media may also be computer code transmitted by a computer data signal embodied in a carrier wave and representing a sequence of instructions that are executable by a processor.

While this disclosure has been described in terms of several exemplary embodiments, there are alterations, modifications, permutations, and various substitute equivalents, which fall within the scope of this disclosure. It should also be noted that there are many alternative ways of implementing the methods and apparatuses of the present disclosure. It is therefore intended that the following appended claims be interpreted as including all such alterations, modifications, permutations, and various substitute equivalents as fall within the true spirit and scope of the present disclosure. As used herein, the phrase "A, B, or C" should be construed to mean a logical ("A OR B OR C"), using a non-exclusive logical "OR," and should not be construed to mean 'only one of A or B or C. Each step within a process may be an optional step and is not required. Different embodiments may have one or more steps removed or may provide steps in a different order. In addition, various embodiments may provide different steps simultaneously instead of sequentially.

What is claimed is:

1. A method for selectively etching at least one feature in a nitrogen or carbon containing dielectric etch layer or a polysilicon etch layer under a mask in a stack, while providing profile control and CD control, comprising:

flowing an etch gas comprising an etchant and a metal containing passivant, forming the etch gas into a plasma; and exposing the dielectric etch layer or polysilicon etch layer to the plasma to simultaneously etch features into the dielectric etch layer and deposit a metal containing passivation on sidewalls of the features.

2. The method, as recited in claim 1, wherein the etchant comprises at least one of a halogen containing component and oxygen containing component.

3. The method, as recited in claim 1, wherein the metal containing passivant comprises a component containing at least one of molybdenum, rhenium, tantalum, tungsten, and vanadium.

4. The method, as recited in claim 1, wherein the mask is a silicon containing or carbon containing mask.

5. The method, as recited in claim 1, wherein the nitrogen or carbon containing dielectric layer comprises silicon, and wherein the etchant comprises a halogen containing component.

6. The method, as recited in claim 5, wherein the halogen containing component, comprises at least one of a hydrofluorocarbon and a fluorocarbon.

7. The method, as recited in claim 1, further comprising using RF excitation power and bias power to control aspect ratio.

8. The method, as recited in claim 1, wherein the metal containing passivant comprises at least one of tungsten hexafluoride, rhenium hexafluoride, molybdenum hexafluoride, tantalum pentafluoride, and vanadium fluoride.

9. The method, as recited in claim 1, further comprising chemically removing the metal containing passivation.

10. The method, as recited in claim 1, wherein the dielectric etch layer or the polysilicon etch layer is over an underlayer, further comprising etching the underlayer.

11. The method, as recited in claim 10 further comprising removing the dielectric etch layer or the polysilicon etch layer.

12. The method, as recited in claim 11, wherein the removing the dielectric etch layer or the polysilicon etch layer removes the metal containing passivation.

13. The method, as recited in claim 1, wherein the nitrogen or carbon containing dielectric layer comprises an amorphous carbon or carbon based layer, and wherein the etchant comprises an oxygen containing etchant.

14. The method, as recited in claim 13, wherein the oxygen containing etching comprises at least one of oxygen, ozone, carbon dioxide, carbon monoxide, carbonyl sulfide, nitrogen dioxide, nitrate, and sulfur dioxide.

15. The method, as recited in claim 1, wherein the nitrogen or carbon containing dielectric etch layer or the polysilicon etch layer is a nitrogen or carbon containing dielectric etch layer and wherein the metal containing passivation comprises a metal carbide or metal nitride, wherein carbon for the metal carbide or nitrogen for the metal nitride is provided by the nitrogen or carbon containing dielectric etch layer.

* * * * *